(12) United States Patent
Molla et al.

(10) Patent No.: US 6,362,089 B1
(45) Date of Patent: Mar. 26, 2002

(54) METHOD FOR PROCESSING A SEMICONDUCTOR SUBSTRATE HAVING A COPPER SURFACE DISPOSED THEREON AND STRUCTURE FORMED

(75) Inventors: Jaynal Abedin Molla, Gilbert; Owen Richard Fay, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/294,060

(22) Filed: Apr. 19, 1999

(51) Int. Cl.$^7$ .......................... H01L 21/44; B05D 3/04; B05D 3/10; B05D 5/12
(52) U.S. Cl. .................. 438/612; 438/677; 438/678; 438/687; 427/98; 427/125; 427/304; 427/405; 427/437; 106/1.23
(58) Field of Search ............................ 438/612, 678, 438/677, 687; 427/98, 125, 304, 437, 405; 106/1.23

(56) References Cited

U.S. PATENT DOCUMENTS

| | | | |
|---|---|---|---|
| 4,626,479 A | 12/1986 | Hosoi et al. ................ 428/663 |
| 4,970,571 A | 11/1990 | Yamakawa et al. ........... 357/71 |
| 5,235,139 A | * 8/1993 | Bengston |
| 5,567,648 A | 10/1996 | Gupta ......................... 437/183 |
| 5,714,238 A | 2/1998 | Komagata et al. .......... 428/208 |
| 5,733,599 A | * 3/1998 | Ferrier et al. |
| 5,843,517 A | 12/1998 | Ferrier et al. ................. 427/98 |
| 5,863,616 A | 1/1999 | Feldstein et al. ........ 427/443.1 |
| 5,865,976 A | 2/1999 | Takeuchi et al. ............ 205/109 |
| 5,876,795 A | 3/1999 | Goldsmith et al. ......... 427/226 |
| 6,044,550 A | * 4/2000 | Larson |

OTHER PUBLICATIONS

Andre M.T. van der Putten and Jan–Willem G. de Bakker, Anisotropic Deposition of Electroless Nickel, Z. Electrochem Soc., vol. 140, No. 8, Aug. 1993.

\* cited by examiner

*Primary Examiner*—Mary Wilczewski
(74) *Attorney, Agent, or Firm*—Lanny Parker

(57) ABSTRACT

A semiconductor wafer having copper bondpads (17) that are free of voids (13) and a method for coating the copper bondpads (17) with solderable or wirebondable metals such that the copper bondpads (17) are free of the voids (13). The void free metal coatings are achieved using a dual activation process. In a first activation step (27), the copper bondpads (17) are activated by placing them in a palladium bath. In a second activation step (28), the bondpads are placed in a nickel-boron bath. After the dual activation, the copper bondpads (17) are coated with a layer of nickel-phosphorous or palladium. The nickel-phosphorous or palladium layer may be coated with a layer of gold for subsequent formation of solder balls or wirebonds thereon.

4 Claims, 2 Drawing Sheets

- *PRIOR ART* -

METHOD FOR PROCESSING A SEMICONDUCTOR SUBSTRATE HAVING A COPPER SURFACE DISPOSED THEREON AND STRUCTURE FORMED

BACKGROUND OF THE INVENTION

The present invention relates, in general, to metallization systems and, more particularly, to copper metallization systems.

Monolithically integrated circuits typically include multiple layers of metal that terminate in bondpads through which electrical signals are transmitted. In the past, the multiple layers of metal have been formed from aluminum. However, semiconductor manufacturers have begun using copper, rather than aluminum, because of copper's superior electromigration performance as well as its lower resistivity. In addition, a copper metallization process can actually lead to lower manufacturing costs than aluminum.

Although there are many advantages to using copper, its surface is not suitable as a terminal metal for packaging interconnections. Separate coating metals are needed to deposit onto the copper bond pads for packaging interconnections. One method is direct deposition of metal onto copper bond pads by an electroless deposition technique such as electroless nickel followed by immersion in gold for flip chip applications and/or electroless palladium deposition followed by immersion in gold for wirebond applications. For such deposition techniques, the copper surface is generally activated with a very thin layer of palladium in a palladium activation bath to allow deposition of a nickel layer thereon. In this step, the palladium covers the copper so that nickel can be electrolessly plated on the layer of palladium. When the palladium only partially covers the copper, a galvanic cell is set up that results in preferential etching at the copper-palladium grain boundaries. The preferential etching causes voids in the copper and undercutting at the interface between the copper and palladium.

FIG. 1 is a highly enlarged cross-sectional view of a semiconductor wafer 10 having a copper bondpad 11 disposed thereon. A layer 12 of nickel is disposed on copper bondpad 11. Copper bondpad 11 has voids 13 at the interface between the copper and nickel layers caused by the use of palladium to activate the copper surface. Voids 13 lower the shear values of the interface, increase the probability of sodium contamination, and create electromigration problems.

Accordingly, it would be advantageous to have a method for electrolessly plating metals on a copper surface that is cost efficient and suitable for use in an integrated circuit manufacturing process. It would be desirable to have a semiconductor structure on which a copper bondpad is disposed that is void-free, i.e., does not have voids, and a method for manufacturing this structure. It would be of further advantage for the method to be suitable for use at temperatures less than about 90 degrees Celsius.

DETAILED DESCRIPTION OF THE DRAWINGS

Generally, the present invention includes a method for forming a metal such as nickel-phosphorous or palladium on a copper surface that is disposed on a semiconductor wafer such that voids are not formed in the copper or at the interface between the copper and nickel. The method uses a dual activation process that includes formation of a layer of palladium on the copper and a layer of nickel-boron on the layer of palladium. A layer of nickel-phosphorous or palladium is formed on the nickel-boron layer. Using the dual activation process produces copper bondpads that do not have voids formed therein. In addition, the present invention is suitable for use in applications that use solder balls as well as applications that use wirebonds.

Figure 2:
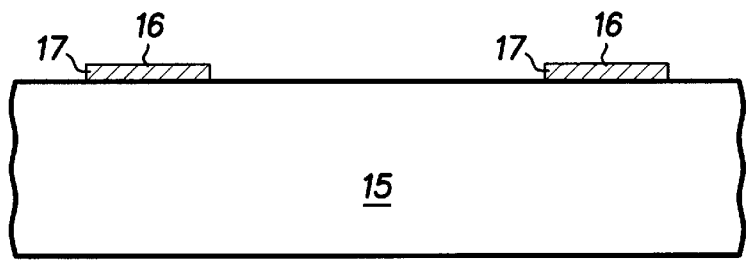
FIG. 2 is a highly enlarged cross-sectional view of a semiconductor wafer having copper bond pads disposed thereon.

FIG. 2 is a cross-sectional view of a substrate such as, for example, a semiconductor wafer 15 having copper bondpads 17 formed thereon. Although the copper interconnect structures are shown as two bondpads, it should be understood this has been done to aid in describing the present invention. Copper bondpads 17 also represent multi-layer interconnect structures.

Figure 3:
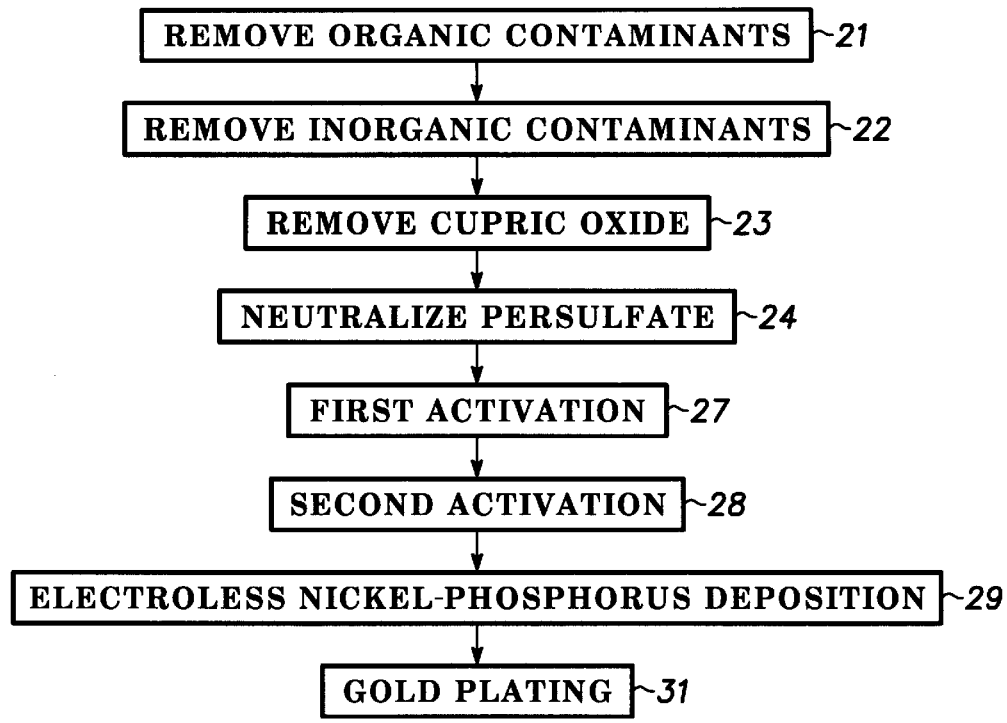
FIG. 3 is a flow diagram of a process flow for treating a copper surface in accordance with a first embodiment of the present invention.

FIG. 3 is a flow diagram 20 of a process flow for treating copper surfaces 16, such as for example, surfaces 16 of copper bondpads 17, in accordance with a first embodiment of the present invention. The process flow illustrated by flow diagram 20 is particularly useful for forming an underbump metallization system on copper surfaces 16. In a first step 21, semiconductor wafer 15 is placed in a plasma etcher and an oxygen plasma is used to remove or clean any organic contaminants from copper surfaces 16. In a second step 22, wafer 15 is placed in a wet etching bath to remove inorganic contaminants. By way of example, the wet etching bath is a buffered oxide etchant.

After removing the organic and inorganic contaminants from copper surfaces 16, it may be desirable to remove any cupric oxide that may have formed on copper surfaces 16. Therefore, a cupric oxide removal step 23 is performed by placing semiconductor wafer 15 in a persulfate bath followed by a sulphuric acid bath in a neutralize persulfate step 24.

After copper surfaces 16 have been cleaned, they are activated by placing semiconductor wafer 15 in a palladium activation bath. TABLE 1 lists the ingredients for the palladium activation bath.

TABLE 1

| | |
|---|---|
| Palladium Sulfate ($Pd^{++}SO_4^{--}$) | ~75 mg/l to ~175 mg/l |
| sulfuric acid ($H_2SO_4$) | ~3% to ~8% by volume |
| Operating Temperature | ~20° C. to ~30° C. |

It should be noted that the symbol ~ is shorthand notation for "approximately", mg/l stands for milligrams per liter, and ° C. stands for degrees Celsius. It should be noted that the units mg/l are also referred to as parts per million (ppm).

By way of example, semiconductor wafer 15 is placed in a palladium bath containing approximately 100 mg/l of palladium sulfate and approximately 5% sulfuric acid by volume for approximately 30 seconds. The palladium reacts with copper surfaces 16 to allow a metal such as, for example, nickel, to be plated on the palladium. Thus, the palladium activation step, identified by reference numeral 27, creates reaction sites on copper surfaces 16 that are more susceptible to reaction with the plating nickel metal than pure copper.

After activating copper surfaces 16 with palladium, the surfaces are activated a second time in an electroless nickel-boron bath having a concentration of lead that is less than approximately 5 mg/l. By way of example, the concentration of lead is between approximately 1 mg/l and approximately 3 mg/l. It is important to keep the lead concentrations at or below 5 mg/l when plating nickel on palladium activated copper surfaces because the lead acts as a deactivating agent. In other words, using lead concentrations greater than 5 mg/l when plating nickel on semiconductor wafers causes skip-plating. This second activation step is identified by reference numeral 28.

Semiconductor wafer 15 is left in the bath long enough to deposit from approximately 0.1 microns to approximately 0.5 microns of nickel-boron. A suitable amount of time to accomplish this deposition is between approximately 1 and 5 minutes, with a nominal time of approximately 2 minutes.

After completing the second activation step (identified by reference numeral 28), semiconductor wafer 15 is placed in a substantially lead-free electroless nickel-phosphorous bath. This step is identified by reference numeral 29.

By way of example, semiconductor wafer 15 is left in the bath long enough to deposit from approximately 6 microns to approximately 9 microns of nickel-phosphorous.

A suitable amount of time to accomplish this deposition is between approximately 30 and 45 minutes, with a nominal time of approximately 30 minutes.

After the nickel-phosphorous layer has been plated on the nickel-boron layer, a layer of gold is deposited on the nickel-phosphorous layer to protect it from oxidation. The layer of gold is also referred to as an oxidation protection layer. This step is identified by reference numeral 31. Preferably, the thickness of the gold layer is between approximately 0.03 microns and 0.06 microns. Techniques for forming a layer of gold on a layer of nickel-phosphorous are well known to those skilled in the art.

Solder balls are formed on the gold layer using techniques well known to those skilled in the art.

Figure 4:
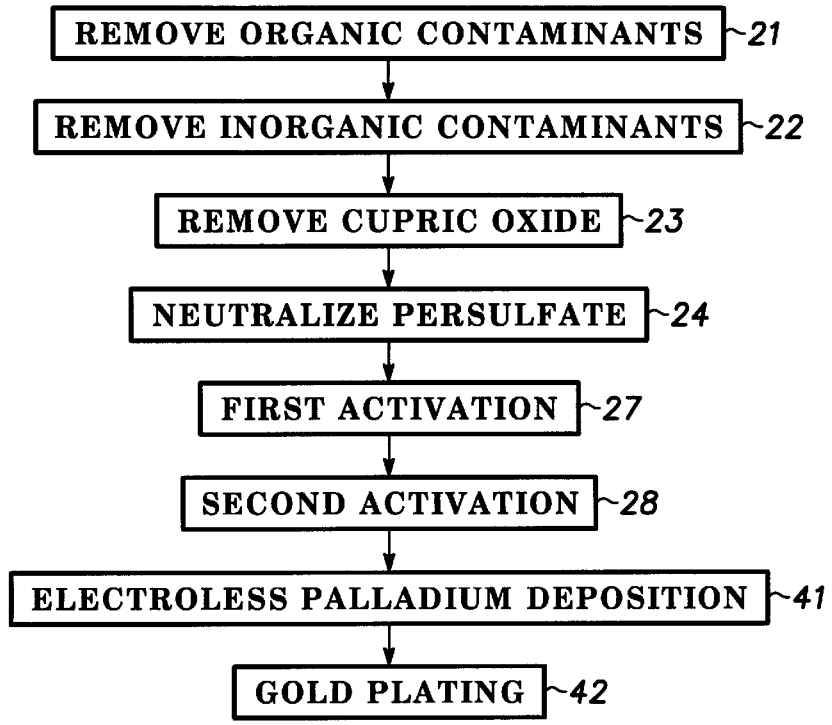
FIG. 4 is a flow diagram of a process flow for treating a copper surface in accordance with a second embodiment of the present invention.

FIG. 4 is a flow diagram 40 of a process flow for treating a copper surface, such as for example, copper surfaces 16, in accordance with a second embodiment of the present invention. The process flow illustrated by flow diagram 40 is particularly useful for forming a metallization system on copper surfaces 16 to which wirebonds can be formed. It should be noted that the steps identified by reference numbers 21, 22, 23, 24, 27, and 28 are the same as those used for the embodiment in which an underbump metallization system was formed. It should be further noted that the same reference numerals are used to represent similar elements. Thus, the second embodiment has been described with the assumption that the electroless nickel-boron layer has been formed.

At the step identified by reference numeral 41, an electroless palladium layer is formed on the electroless nickel-boron layer. The electroless palladium layer is formed by placing semiconductor wafer 15 in an electroless palladium bath.

Semiconductor wafer 15 is left in the bath long enough to deposit from approximately 0.4 microns to approximately 0.8 microns of palladium on the electroless nickel-boron layer. A suitable amount of time to accomplish this deposition is between approximately 30 and 60 minutes, with a nominal time of approximately 30 minutes.

After the palladium layer has been plated on the nickel-boron layer, an optional layer of gold is deposited on the palladium layer to protect it from oxidation. This step is identified by reference numeral 42. Preferably, the thickness of the gold layer is between approximately 0.03 and 0.06 microns. Techniques for forming a layer of gold on a layer of nickel-phosphorous are well known to those skilled in the art.

Wirebonds are formed on the gold layer using techniques well known to those skilled in the art. Again, it should be understood that forming the layer of gold on the electroless palladium is an optional step. Thus, the wirebonds can be formed directly on the electroless palladium layer.

Figure 1:
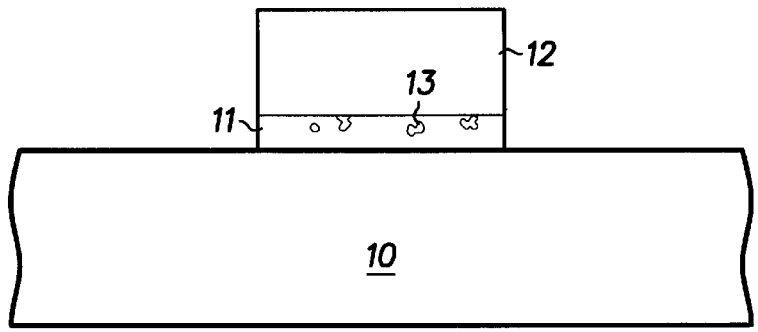
FIG. 1 is a highly enlarged cross-sectional view of a semiconductor wafer having copper bondpads disposed thereon, wherein voids are present at a copper-nickel interface.
Figure 5:
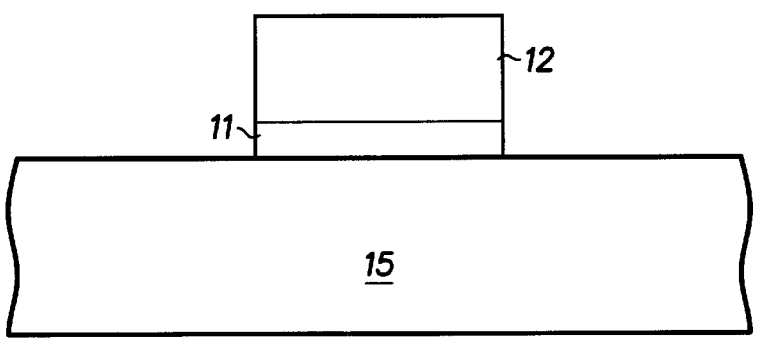
FIG. 5 is a highly enlarged cross-sectional view of a semiconductor wafer having copper bondpads disposed thereon processed in accordance with the present invention.

FIG. 5 is a highly enlarged cross-sectional view of a semiconductor wafer having copper bondpads disposed thereon and processed in accordance with the present invention. It should be noted that the voids present in FIG. 1 are not present in semiconductor wafers manufactured in accordance with the present invention.

By now it should be appreciated that a method for processing a wafer having copper bondpads that does not produce voids in the copper has been provided. An important aspect of the present invention is recognizing the need for an electroless nickel bath having a low concentration of lead. The method entails the use of a dual activation process that allows processing the wafer at temperatures less than about 90° C. Using the low temperatures set forth in the present invention allows formation of reliable copper interconnects on a semiconductor wafer. In addition, eliminating the copper voids enables the use of very thin copper interconnects for highly dense integrated circuits. Further, eliminating the copper voids increases bond shear strength and bond pull strength between the copper and nickel interface which improves long term reliability. Additionally, the dual activation process enhances the capability of ultra fine pitch plating.

What is claimed is:

1. A method for processing a semiconductor substrate having a copper surface disposed thereon in preparation for subsequent bonding operations, comprising the steps of:

providing the semiconductor substrate having copper disposed thereon, the copper having a bonding surface;

cleaning the bonding surface;

activating the bonding surface a first time in a palladium bath;

activating the bonding surface a second time in an electroless nickel-boron bath; and depositing one of a solderable or a wirebondable metal on the bonding surface.

2. The method for processing a semiconductor substrate of claim 1 wherein activating the bonding surface a second time in an electroless nickel-boron bath includes activation in the electroless nickel-boron bath having a concentration of lead.

3. A method for forming a nickel layer over copper, wherein the copper is disposed on a semiconductor wafer, comprising the steps of:

cleaning a surface of the copper;

performing a first activation step to activate the surface in a palladium activation bath;

performing a second activation step to activate the surface, wherein performing the second activation step includes depositing a layer of nickel-boron using electroless plating; and plating one of a solderable or a wirebondable metal on the activated surface.

4. The method of claim 3, further including performing the first and second activation steps and performing the step of plating one a solderable or a wirebondable metal at temperatures less than approximately 90 degrees Celsius.

* * * * *